(12) United States Patent
Galler et al.

(10) Patent No.: US 10,928,257 B2
(45) Date of Patent: Feb. 23, 2021

(54) SENSOR AND METHOD FOR MEASURING A PRESSURE

(71) Applicant: TDK Electronics AG, Munich (DE)

(72) Inventors: Martin Galler, Kalsdorf (AT); Harald Kastl, Bad Gams (AT); Markus Puff, Graz (AT)

(73) Assignee: TDK ELECTRONICS AG, Munich (DE)

( * ) Notice: Subject to any disclaimer, the term of this patent is extended or adjusted under 35 U.S.C. 154(b) by 495 days.

(21) Appl. No.: 15/767,098

(22) PCT Filed: Oct. 7, 2016

(86) PCT No.: PCT/EP2016/074082
§ 371 (c)(1),
(2) Date: Apr. 9, 2018

(87) PCT Pub. No.: WO2017/060478
PCT Pub. Date: Apr. 13, 2017

(65) Prior Publication Data
US 2018/0292272 A1    Oct. 11, 2018

(30) Foreign Application Priority Data

Oct. 8, 2015 (DE) .......................... 102015117203.8

(51) Int. Cl.
*G01L 1/16* (2006.01)
*G01L 5/00* (2006.01)
(Continued)

(52) U.S. Cl.
CPC .............. *G01L 1/16* (2013.01); *G01L 5/0038* (2013.01); *G01L 9/08* (2013.01); *H01L 41/0477* (2013.01);
(Continued)

(58) Field of Classification Search
CPC . G01L 1/16; G01L 9/08; G01L 5/0038; H01L 41/1876; H01L 41/0477; H01L 41/083; H01L 41/1132
See application file for complete search history.

(56) References Cited

U.S. PATENT DOCUMENTS 3,426,424 A * 2/1969 Touchy ................ H04R 23/006
                                                     438/50
4,346,041 A    8/1982 Aristoff
(Continued)

FOREIGN PATENT DOCUMENTS

CN    1672272 A    9/2005
CN    1856887 A    11/2006
(Continued)

OTHER PUBLICATIONS

Schöner, A., "Meßtechnik," Heidelberg: Springer, 1994, 8 pages.

*Primary Examiner* — Emily P Pham
(74) *Attorney, Agent, or Firm* — Slater Matsil, LLP

(57) ABSTRACT

A sensor and a method for measuring a pressure are disclosed. In an embodiment the sensor includes a main body including a piezoelectric material and at least two internal electrodes arranged in the piezoelectric material, wherein the at least two internal electrodes are arranged in such a way that a voltage arises between the at least two internal electrodes when a pressure acts on a side surface of the main body that is provided for an application of pressure.

17 Claims, 3 Drawing Sheets

(51) Int. Cl.
*H01L 41/113* (2006.01)
*H01L 41/047* (2006.01)
*H01L 41/083* (2006.01)
*H01L 41/187* (2006.01)
*G01L 9/08* (2006.01)

(52) U.S. Cl.
CPC ........ *H01L 41/083* (2013.01); *H01L 41/1132* (2013.01); *H01L 41/1876* (2013.01)

(56) References Cited

U.S. PATENT DOCUMENTS

| | | | |
|---|---|---|---|
| 4,545,254 A * | 10/1985 | Lawless | G01L 9/0005 361/282 |
| 5,729,077 A | 3/1998 | Newnham et al. | |
| 6,411,491 B2 * | 6/2002 | Lawless | H01G 4/005 361/276 |
| 6,690,567 B1 * | 2/2004 | Lawless | H01G 4/1218 29/25.42 |
| 7,180,223 B2 * | 2/2007 | Ozaki | H03H 3/08 310/313 A |
| 7,309,944 B2 | 12/2007 | Lubitz et al. | |
| 8,410,663 B2 | 4/2013 | Sakamoto et al. | |
| 8,922,098 B2 | 12/2014 | Karkkainen et al. | |
| 9,183,710 B2 * | 11/2015 | Zellers | H01L 41/1132 |
| 9,252,351 B2 | 2/2016 | Gabl | |
| 10,018,521 B2 | 7/2018 | Hall | |
| 10,619,611 B2 * | 4/2020 | Asakura | H01L 41/083 |
| 2002/0096973 A1 | 7/2002 | Zhang et al. | |
| 2003/0115966 A1 | 6/2003 | Ueno et al. | |
| 2004/0185278 A1 | 9/2004 | Sato | |
| 2006/0232172 A1 | 10/2006 | Asano et al. | |
| 2006/0273687 A1 | 12/2006 | Fujimoto et al. | |
| 2007/0069610 A1 | 3/2007 | Ono et al. | |
| 2008/0238264 A1 | 10/2008 | Nakamura et al. | |
| 2010/0078505 A1 | 4/2010 | Kato | |
| 2010/0220426 A1 * | 9/2010 | Shimizu | H01G 4/30 361/306.3 |
| 2010/0282874 A1 * | 11/2010 | Nakamura | H01L 41/0471 239/585.1 |
| 2010/0320284 A1 | 12/2010 | Okamura | |
| 2010/0321860 A1 * | 12/2010 | Osawa | H01G 4/012 361/303 |
| 2013/0099627 A1 * | 4/2013 | Fujii | H01L 41/0471 310/311 |
| 2013/0221807 A1 | 8/2013 | Shimizu et al. | |
| 2013/0342083 A1 * | 12/2013 | Schmidt | H02N 2/067 310/366 |
| 2014/0020659 A1 * | 1/2014 | Kato | F02M 51/0603 123/456 |
| 2015/0042439 A1 * | 2/2015 | Matsushita | H01F 17/0013 336/200 |
| 2015/0096878 A1 * | 4/2015 | Aliane | H01L 41/1132 200/600 |
| 2015/0155474 A1 * | 6/2015 | Tanimoto | H01L 41/0933 310/332 |
| 2015/0171306 A1 * | 6/2015 | Kato | H01L 41/0475 123/456 |
| 2017/0198669 A1 * | 7/2017 | Yamamoto | F02M 37/04 |
| 2018/0200758 A1 * | 7/2018 | Schafer | G10K 9/121 |

FOREIGN PATENT DOCUMENTS

| | | |
|---|---|---|
| CN | 102290526 A | 12/2011 |
| CN | 102686507 A | 9/2012 |
| CN | 102790168 A | 11/2012 |
| DE | 69635870 T2 | 11/2006 |
| DE | 102006001134 A | 7/2007 |
| DE | 102010055934 A1 | 6/2012 |
| EP | 2124268 A1 | 11/2009 |
| JP | S57142530 A | 9/1982 |
| JP | H04346041 A | 12/1992 |
| JP | 2002214030 A | 7/2002 |
| JP | 2002333373 A | 11/2002 |
| JP | 2012112824 A | 6/2012 |
| JP | 2015175811 A | 10/2015 |
| WO | 2008066098 A1 | 6/2008 |
| WO | 2015115279 A1 | 8/2015 |

* cited by examiner

- Prior art -

SENSOR AND METHOD FOR MEASURING A PRESSURE

This patent application is a national phase filing under section 371 of PCT/EP2016/074082, filed Oct. 7, 2016, which claims the priority of German patent application 10 2015 117 203.8, filed Oct. 8, 2015, each of which is incorporated herein by reference in its entirety.

TECHNICAL FIELD

The present invention relates to a sensor and a method for measuring a pressure.

BACKGROUND

Sensors based on piezoelectric materials, such as a lead zirconate titanate (PZT) ceramic or quartz, for example, are known. FIG. 1 shows such a monolithic piezoelectric sensor 101. The latter comprises a monolithic main body 102, which consists of a homogeneous layer of a pressure-sensitive material. External electrodes 105, 108 are respectively arranged on an upper side surface 109 and a lower side surface 110 of the main body 102, such that the layer of the pressure-sensitive material is situated between the external electrodes 105, 108. The external electrodes 105, 108 serve for tapping off the electrical signal that arises in the event of pressure loading.

In the case of the sensor 101, the pressure to be measured acts directly on the external electrodes 105, 108. Numerous disadvantages are associated with this. The external electrodes 105, 108 have to be covered with insulation layers in order to prevent leakage currents from arising. Moreover, electrical connections of the external electrodes 105, 108 furthermore have to be provided on the upper and lower side surfaces 106, 107, such that the surfaces 106, 107 cannot be used over the whole area for the pressure loading. The external electrodes 105, 108 comprise a metallic material, which with tenable outlay is only able to be manufactured with an inadequate flatness. The unevenness on the surfaces 106, 107 can lead to measurement inaccuracies. Moreover, under constantly occurring alternating pressure loads, the metallic external electrodes 105, 108 exhibit high wear effects that can shorten the lifetime of the sensor 101. Furthermore, in the monolithic embodiment, the attachment of a mechanical amplification system that translates small pressures into high pressures acting on the sensor is made more difficult.

SUMMARY OF THE INVENTION

Embodiments provide an improved sensor which makes it possible to overcome at least one of the disadvantages mentioned above. Further embodiments provide an improved method for measuring a pressure.

In an embodiment a sensor comprises a main body, wherein the main body comprises a piezoelectric material and at least two internal electrodes arranged in the piezoelectric material. In this case, the at least two internal electrodes are arranged in the piezoelectric material in such a way that a voltage arises between the at least two internal electrodes if a pressure acts on a side surface of the main body that is provided for an application of pressure.

The sensor can be a pressure sensor, in particular. Accordingly, the sensor can be configured to measure pressure acting on the main body.

The sensor may measure a pressure, or a mechanical stress, with the aid of the piezoelectric effect. In this case, the pressure acting on the sensor is converted into an electrical charge flow. This property can be employed to measure pressures or pressure fluctuations.

In various embodiments, the internal electrodes can be referred to as "arranged in the piezoelectric material" if they are arranged between two layers of the piezoelectric material. Accordingly, a top side and an underside of each internal electrode can be covered by the piezoelectric material. However, a lateral surface bearing against an external electrode can be free of the piezoelectric material.

In various further embodiments, the side surface of the main body that is provided for the application of pressure is, in particular, a side surface of the main body that is arranged parallel to the internal electrodes. The main body can also comprise a plurality of side surfaces provided for the application of pressure.

The sensor can comprise an arbitrary number of internal electrodes. In particular, the sensor can comprise more than two internal electrodes. The internal electrodes can be divided into first internal electrodes contacted with a first external electrode, and second internal electrodes contacted with a second external electrode, wherein the number of first and second internal electrodes need not be identical.

The sensor comprising internal electrodes arranged in the in the piezoelectric material makes it possible to overcome the disadvantages described above. The side surface provided for the application of pressure can comprise of the piezoelectric material. Under constant alternating pressure loading, the piezoelectric material can have a significantly higher loading capacity than a metallic material, such that the lifetime of the sensor is increased. Furthermore, the piezoelectric material can be manufactured with a high degree of flatness, such that the side surface provided for the application of pressure is free of unevenness and no measurement errors can result therefrom.

In various embodiments a mechanical amplification system that amplifies the pressures acting on the sensor is fit to the sensor. It is particularly advantageous to fit this system on the side surfaces of the main body parallel to the internal electrodes.

A further advantage of the sensor includes the improved design freedom. The output signal generated by the sensor can be influenced in a desired manner by means of a variation in the number of internal electrodes. What can be achieved in this case, in particular, is that the current intensity of the signal or the voltage of the signal is increased.

The sensor can furthermore comprise a first external electrode and a second external electrode. Each of the at least two internal electrodes can be connected to the first external electrode or the second external electrode. The first external electrode can be arranged on a first side surface of the main body. The second external electrode can be arranged on a second side surface of the main body. Neither the first side surface nor the second side surface can be provided for the application of pressure. Accordingly, they differ from the side surface provided for the application of pressure and are arranged in particular perpendicularly to the side surface. The first and second side surfaces can be situated opposite one another.

The first external electrode can be arranged perpendicularly to the at least two internal electrodes. The second external electrode can be arranged perpendicularly to the at least two internal electrodes.

In various embodiments, since the pressure acts in a direction perpendicular to the internal electrodes, the pressure exerts only a minimal force on the external electrodes, which likewise extend in this direction.

The side surface of the main body that is provided for an application of pressure can be arranged parallel to the at least two internal electrodes. Accordingly, the pressure preferably exerts a maximum force on the side surface.

The sensor can further comprise an evaluation unit connected to the at least two internal electrodes, the evaluation unit being configured to determine the pressure acting on the main body. In this case, the at least two internal electrodes can be electrically contacted with one another via the evaluation unit, wherein the evaluation unit is configured to measure a current flowing between the at least two internal electrodes and to determine therefrom the pressure acting on the main body. Alternatively, the evaluation unit can also be configured to measure a voltage present between the at least two internal electrodes and to determine therefrom the pressure acting on the main body.

Depending on the configuration of the evaluation unit, the sensor can be configured in such a way that the current intensity or the voltage of an electrical signal generated owing to a pressure acting on the main body is particularly high. A high voltage arises in the case of a small number of internal electrodes. A high current intensity arises in the case of a large number of internal electrodes.

The piezoelectric main body can comprise a lead zirconate titanate ceramic. Alternatively, the piezoelectric main body can comprise some other piezoelectric material, for example, a piezoelectric quartz. The internal electrodes can comprise silver, silver-palladium or copper or can consist of one of these materials.

The first and second external electrodes can comprise or consist of a partial vitreous firing metallization composed of silver, silver-palladium or copper. The first and second external electrodes can furthermore comprise a sputtering layer composed of CuAg or CrNiAg.

In accordance with one exemplary embodiment, the sensor can comprise a mechanical amplification system configured to translate a deformation of the mechanical amplification system owing to a pressure acting on the sensor into a deformation of the main body.

In this case, the mechanical amplification system can be arranged on the side surface of the main body that is provided for an application of pressure. Furthermore, the sensor can comprise a second mechanical amplification system, which is arranged on the side surface situated opposite the side surface provided for the application of pressure.

The mechanical amplification system can comprise a first region, which is secured to the main body and a second region, which is spaced apart from the main body and is movable relative to the main body.

In accordance with a further aspect, the present invention relates to a method for measuring a pressure.

In embodiments, a method for measuring a pressure by a sensor is proposed, wherein the sensor comprises a main body comprising a piezoelectric material, at least two internal electrodes arranged in the piezoelectric material, a first external electrode and a second external electrode, wherein each of the at least two internal electrodes is connected to the first external electrode or the second external electrode, wherein the first external electrode is arranged on a first side surface of the main body, wherein the second external electrode is arranged on a second side surface of the main body, and wherein the main body furthermore comprises a third side surface, which is free of the first external electrode and the second external electrode. In the method, the pressure to be measured is exerted on the third side surface.

In particular, the sensor described above can be used for the method in accordance with the aspect discussed here. Accordingly, all structural and functional features disclosed for the sensor can also apply to the method.

In various embodiments, the pressure to be measured is exerted on a side surface of the main body that is free of electrodes. Various advantages can be achieved as a result. The third side surface provided for the application of pressure can consist of the piezoelectric material. Under constant alternating pressure loading, the piezoelectric material can have a significantly higher loading capacity than a metallic material, such that the lifetime of the sensor is increased. Furthermore, the piezoelectric material can be manufactured with a high degree of flatness, such that the side surface provided for the application of pressure is free of unevenness and no measurement errors can result therefrom.

Furthermore, a voltage can arise between the at least two internal electrodes owing to the pressure exerted on the third side surface, wherein the sensor can furthermore comprise an evaluation unit connected to the at least two internal electrodes. The method can comprise the step of determining the pressure acting on the main body on the basis of a current intensity measured by the evaluation unit or on the basis of a voltage measured by the evaluation unit.

A mechanical amplification system can be arranged on the side surface on which the pressure is exerted. The mechanical amplification system can be configured in such a way that a pressure that acts on the mechanical amplification system deforms the latter, wherein the deformation of the mechanical amplification system is converted into a deformation of the main body. In particular, the main body can be stretched or compressed in this case. The mechanical amplification system can be configured in such a way that a pressure exerted on the amplification system leads to a deformation of the main body which is ten times greater than the deformation that the main body would experience if the same pressure were exerted directly on the main body.

The mechanical amplification system can comprise a frustoconical element, for example, a metal sheet composed of titanium. The mechanical amplification system can comprise a first region, which is secured to the main body, and a second region, which is arranged at a distance from the main body. The second region can be moved relative to the main body.

BRIEF DESCRIPTION OF THE DRAWINGS

The present invention is described in greater detail below with reference to the figures.

DETAILED DESCRIPTION OF ILLUSTRATIVE EMBODIMENTS

Figure 2:
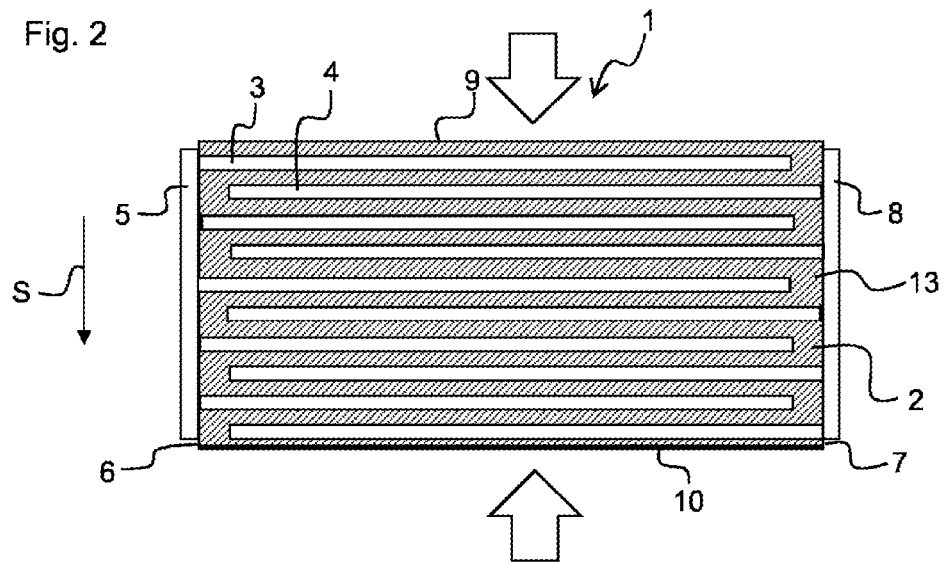
FIG. 2 shows a first exemplary embodiment of a sensor.

FIG. 2 shows a sensor 1 in accordance with a first exemplary embodiment. The sensor 1 comprises a main body 2 comprising a piezoelectric material 13. First internal electrodes 3 and second internal electrodes 4 are arranged in the main body 2. In this case, the internal electrodes 3, 4 are respectively arranged between layers of the piezoelectric material 13.

The first internal electrodes 3 are electrically contacted with a first external electrode 5. The first external electrode 5 is arranged on a first side surface 6 of the main body 2. The first side surface 6 of the main body 2 and also the first external electrode 5 are in this case perpendicular to the internal electrodes 3, 4. Furthermore, the first internal electrodes 3 are set back relative to a second outer surface 7 situated opposite the first side surface 6. A second external electrode 8 is arranged on the second side surface 7. The first internal electrodes 3 are not electrically contacted with the second external electrode 8.

The second internal electrodes 4 are electrically contacted with the second external electrode 8. The second internal electrodes 4 are set back relative to the first side surface 6 and are accordingly not electrically connected to the first external electrode 5.

First internal electrodes 3 and second internal electrodes 4 alternate in a stacking direction S that is perpendicular to the internal electrodes 3, 4, wherein a layer consisting of the piezoelectric material 13 is respectively arranged between two internal electrodes 3, 4.

The main body 2 furthermore comprises at least one side surface 9, 10 that is provided for an application of pressure. The direction from which the pressure acts on the main body 2 is marked by two corresponding arrows in FIG. 1. The side surface 9, 10 provided for the application of pressure extends parallel to the internal electrodes 3, 4. In the case of the sensor 1 shown in FIG. 1, an upper side surface 9 and a lower side surface 10 are provided for the application of pressure.

If a pressure then acts on the side surfaces 9, 10 provided for the application of pressure, the pressure acts on the piezoelectric material 13 of the main body 2. On account of the piezoelectric effect, the polarization of the piezoelectric material 13 is thereby changed under the action of the pressure. This is associated with an accumulation of electrical charge that arises in the piezoelectric material 13 and can be conducted away via the internal electrodes 3, 4. The greater the pressure acting on the sensor 1, the more charge is generated in the main body 2 and conducted away via the internal electrodes 3, 4 to the respective external electrodes 5, 8.

The relationship between the electric field generated in the main body 2 and the pressure exerted on the main body 2 is described by the two equations (1) and (2):

$$s = d_{33}E + s_{33}T \quad (1)$$

$$D = \varepsilon_{33}\varepsilon_0 E + d_{33}T \quad (2)$$

In this case, s indicates the mechanical strain of the main body 2, D indicates the displacement density, E indicates the electric field strength of the electric field that arises owing to the piezoelectric effect, T indicates the mechanical stress acting on the main body, d indicates the piezo constant of the piezoelectric material 13 of the main body 2, $\varepsilon_{33}$ and $\varepsilon_0$ indicate the relative permitivities and $s_{33}$ indicates the compliance. It is furthermore assumed in equations (1) and (2) that the pressure axis, the polarization axis and the detection axis each correspond and lie in the stacking direction S, which here is also referred to as the 33-direction.

If the electric field generated is then measured, the pressure acting on the main body 2 can be calculated therefrom.

In order to measure the field, either a voltage present at the external electrodes 5, 8 or a current intensity of a current that flows upon the short-circuiting of the external electrodes 5, 8 can be measured.

Figure 3:
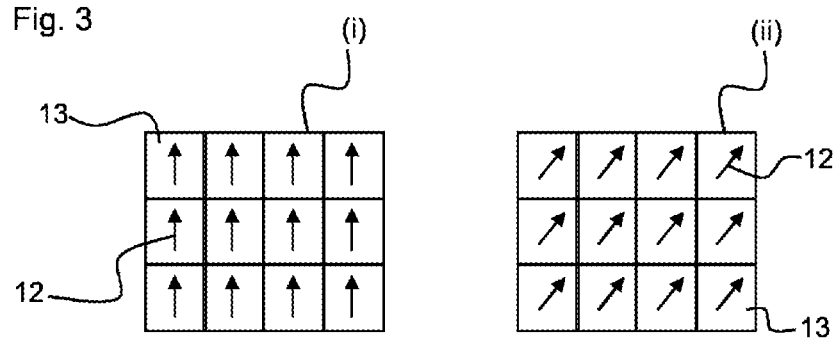
FIG. 3 shows, in a schematic illustration, the variation of the polarization of a piezoelectric material under the action of pressure.

FIG. 3 indicates that the polarization direction 12 of the piezoelectric material 13 changes under the action of a pressure. Excerpt i shows the polarization without the action of a pressure and excerpt ii shows the polarization with pressure acting.

Figure 4:
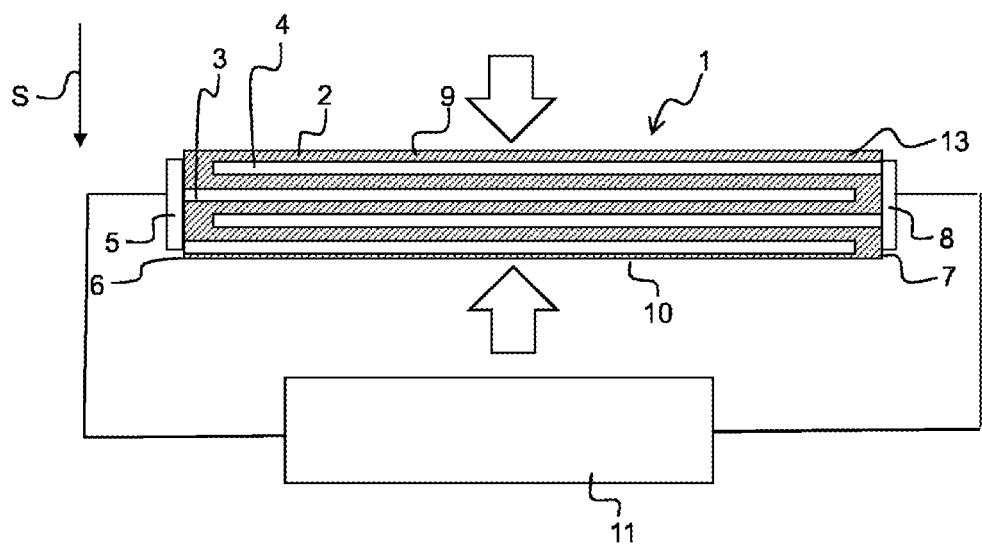
FIG. 4 shows a second exemplary embodiment of a sensor.

FIG. 4 shows a possible set-up for pressure measurement with the aid of the sensor 1, wherein a sensor 1 in accordance with a second exemplary embodiment is used here. The sensor 1 in accordance with the second exemplary embodiment differs from the sensor 1 in accordance with the first exemplary embodiment in terms of the number of first and second internal electrodes 3, 4.

Furthermore, the sensor 1 is connected to an electronic evaluation unit 11. In accordance with the exemplary embodiment shown in FIG. 4, the first external electrode 5 and the second external electrode 8 are electrically contacted with one another via the electronic evaluation unit 11. Accordingly, upon the action of a pressure on the main body 2, a current flows from the first external electrode 5 via the evaluation unit 11 to the second external electrode 8. The evaluation unit 11 is configured to measure the current intensity of the current. The pressure acting on the main body 2 can be calculated from this measurement variable.

In accordance with an alternative exemplary embodiment, the first external electrode 5 and the second external electrode 8 are not short-circuited with one another via the electronic evaluation unit 11. In this case, the evaluation unit 11 can determine a voltage present between the two external electrodes 5, 8 and calculate the pressure acting on the main body 2 from this measurement variable.

Figure 1:
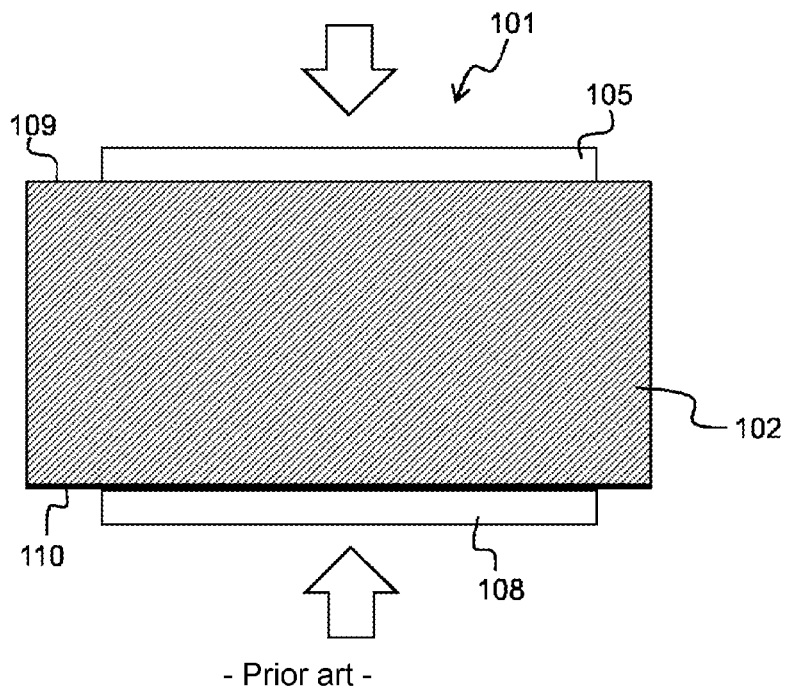
FIG. 1 shows a monolithic sensor that is known in the prior art.

The sensors 1 comprising internal electrodes 3, 4 arranged in the main body 2 as described here have considerable advantages over the monolithic sensors 101 shown in FIG. 1. In particular, the sensors 1 are configured in such a way that the pressure loading does not act on the side surface 6, 7 on which the external electrodes 5, 8 are situated. The side surfaces 9, 10 provided for the application of pressure consist of an electrically insulating piezoelectric material 13. Therefore, an additional insulation layer is not required in order to avoid leakage currents. Furthermore, no electrical contacting takes place on the surfaces to which pressure is applied, such that the surfaces can be loaded by the pressure for the whole area. By contrast, if external electrodes were provided on the side surfaces to be acted on, then a part of the surface would have to be used for the electrical contacting of the external electrodes.

Since the side surface provided for the application of pressure consists of a piezoelectric material 13, it can be manufactured with a high degree of flatness, which can result in a high measurement accuracy, in particular. Surfaces composed of a piezoelectric material 13 can be manufactured with lower outlay with a higher degree of flatness than would be possible for metallic surfaces. Furthermore, the piezoelectric materials 13 prove to be very durable vis-à-vis alternating pressure loads, such that a side surface consisting of a piezoelectric material 13 can increase the lifetime of the sensor 1.

A further advantage of the sensor described here consists in the high design freedom thereof. By virtue of the fact that the number of internal electrodes can be varied in a desired manner, the output charge conducted away via the internal electrodes and/or the voltage present between the internal electrodes can be set in a desired manner. The relationship between these variables is described by formulae (3) to (5).

$$Q_n = n \cdot Q_0 \quad (3)$$

$$U_n = U_0/n \quad (4)$$

$$E_n = (Q_n \cdot U_n)/2 = (Q_0 \cdot U_0)/2 = E_0 \quad (5)$$

In this case, n indicates the number of piezoelectric layers. $Q_n$ indicates the charge output of the sensor 1 comprising n piezoelectric layers. $Q_0$ indicates the charge output of a monolithic sensor 101 without integrated internal electrodes and with the same volume. $U_n$ indicates the open-circuit voltage of the sensor 1 comprising n piezoelectric layers that is present between the external electrodes 5, 8 if the external electrodes 5, 8 are not short-circuited with one another. $U_0$ indicates the open-circuit voltage between the external electrodes 105, 108 of the corresponding monolithic sensor 101. $E_n$ indicates the output energy of the sensor 1 comprising n piezoelectric layers, which is proportional to the product of open-circuit voltage and charge output. $E_0$ indicates the output energy of the monolithic sensor 101.

Formulae (3) to (5) show that the output energy $E_n$ is independent of the number of internal electrodes 3, 4. By contrast, the output voltage $Q_n$ is inversely proportional to the number of internal electrodes 3, 4. The charge output $Q_n$, which substantially determines the current intensity of an electrical signal when the two external electrodes 5, 8 are connected, is directly proportional to the number of internal electrodes. For an evaluation unit 11 in which measurements are intended to be performed on the basis of the current intensity of the output current, a sensor 1 comprising many internal electrodes 3, 4 is therefore advantageous since a higher output current intensity is achieved here, as a result of which the sensitivity of the sensor 1 can be increased. For a sensor 1 in which the evaluation unit 11 measures on the basis of the output voltage, by contrast, a sensor 1 having a small number of internal electrodes 3, 4 is advantageous since a maximum sensitivity can be achieved in this way.

Figure 5:
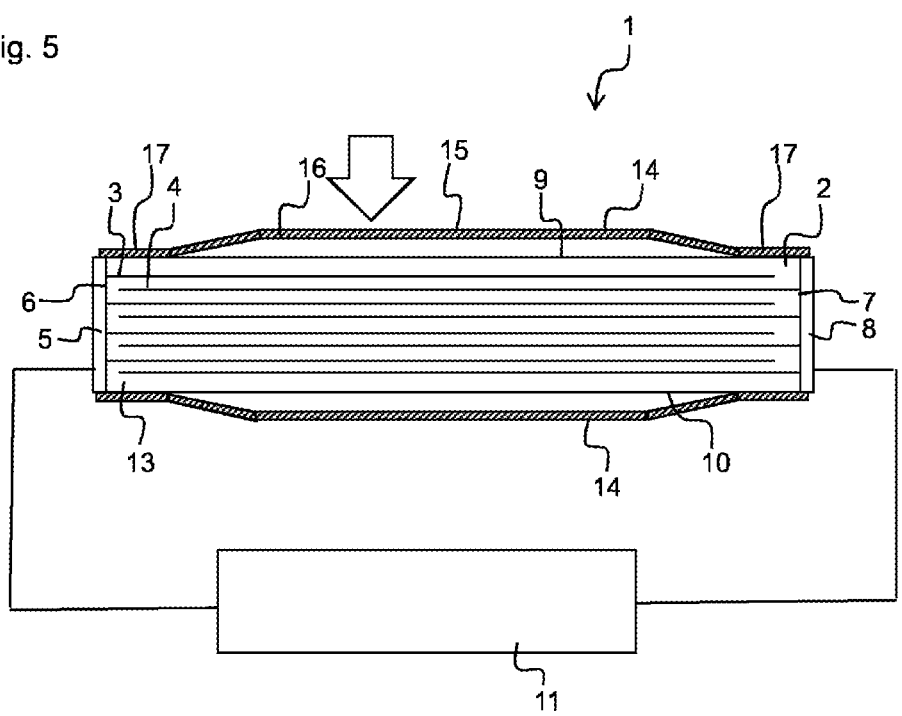
FIG. 5 shows a third exemplary embodiment of a sensor comprising a mechanical amplification system.

FIG. 5 shows a third exemplary embodiment of a sensor 1. In contrast to the sensors 1 in accordance with the first and second exemplary embodiments, the sensor 1 additionally comprises a mechanical amplification system 14. The mechanical amplification system 14 makes it possible to amplify a pressure exerted on the sensor 1.

The mechanical amplification system 14 comprises a frustoconical element 15, which is secured on the upper side surface 9 of the main body 2. By way of example, the frustoconical element 15 is fixedly adhesively bonded on the upper side surface 9.

The frustoconical element 15 comprises a first region 16, which is secured to the upper side surface 9. The first region 16 is an edge region of the frustoconical element 15. The frustoconical element 15 furthermore comprises a second region 17, which is spaced apart from the upper side surface. The second region 17 can be moved toward the main body 2 or away from the main body 2. If a force, for example, as a result of the pressure, is exerted on the second region 17, as a result of which the second region 17 is moved in the direction of the upper side surface 9, then the first region 16 is extended outward in a radial direction. The main body 2 can be stretched as a result.

In particular, the mechanical amplification system 14 is designed in such a way that a pressure acting on the amplification system 14 leads to a deformation of the mechanical amplification system 14. Since the mechanical amplification system 14 is secured to the upper side surface 9, the deformation of the amplification system 14 has the effect that the main body 2 is stretched or compressed. The amplification system 14 can increase the deformation of the main body 2 ten-fold, for example, relative to the deformation that the main body 2 would experience if the force acted directly on the main body 2.

As already discussed above, the mechanical amplification system 14 is secured to the upper side surface 9, i.e., to a side surface that is free of the external electrodes 5, 8. In this way, it can be ensured that the external electrodes 5, 8 cannot be damaged by the mechanical amplification system 14.

Furthermore, a second mechanical amplification system 14 is arranged on the lower side surface 10, the second mechanical amplification system being substantially structurally identical to the amplification system 14 described above.

The invention claimed is:

1. A sensor comprising:
a main body comprising:
a piezoelectric material;
at least two internal electrodes arranged in the piezoelectric material; and
a first mechanical amplification system configured to translate a deformation of the first mechanical amplification system based on the pressure acting on the sensor into a deformation of the main body, wherein the first mechanical amplification system comprises a metal sheet composed of titanium;
wherein the at least two internal electrodes are arranged in such a way that a voltage arises between the at least two internal electrodes when a pressure acts on a side surface of the main body that is provided for an application of pressure.

2. The sensor according to claim 1, wherein the side surface that is provided for the application of pressure consists of the piezoelectric material.

3. The sensor according to claim 1, further comprising:
a first external electrode arranged on a first side surface of the main body; and
a second external electrode arranged on a second side surface of the main body,
wherein each of the at least two internal electrodes is connected to the first external electrode or the second external electrode, and
wherein neither the first side surface nor the second side surface that is provided for the application of pressure.

4. The sensor according to claim 3, wherein the first external electrode is arranged perpendicularly to the at least two internal electrodes, and wherein the second external electrode is arranged perpendicularly to the at least two internal electrodes.

5. The sensor according to claim 3, wherein the first and second external electrodes comprise a partial vitreous firing metallization composed of silver, silver-palladium or copper.

6. The sensor according to claim 3, wherein the first and second external electrodes comprise a sputtering layer composed of CuAg or CrNiAg.

7. The sensor according to claim 1, wherein the side surface that is provided for the application of pressure is arranged parallel to the at least two internal electrodes.

8. The sensor according to claim 1, further comprising an evaluation unit connected to the at least two internal electrodes, wherein the evaluation unit is configured to determine the pressure acting on the main body.

9. The sensor according to claim 8, wherein the at least two internal electrodes are electrically contacted with one another via the evaluation unit, and wherein the evaluation unit is configured to measure a current flowing between the at least two internal electrodes and to determine therefrom the pressure acting on the main body.

10. The sensor according to claim 8, wherein the evaluation unit is configured to measure a voltage between the at least two internal electrodes and to determine therefrom the pressure acting on the main body.

11. The sensor according to claim 1, wherein the main body comprises a lead zirconate titanate ceramic.

12. The sensor according to claim 1, wherein the internal electrodes comprise silver, silver-palladium or copper.

13. The sensor according to claim 1, wherein the first mechanical amplification system is arranged at the side surface that is provided for the application of pressure.

14. The sensor according to claim 13, further comprising a second mechanical amplification system, wherein the second mechanical amplification system is arranged on a side surface situated opposite the side surface that is provided for the application of pressure.

15. The sensor according to claim 1, wherein the first mechanical amplification system comprises a first region secured to the main body, and a second region spaced apart from the main body and movable relative to the main body.

16. A method for measuring a pressure with a sensor, wherein the sensor comprises a main body comprising a piezoelectric material, at least two internal electrodes arranged in the piezoelectric material, a first external electrode, a second external electrode, and a first mechanical amplification system configured to translate a deformation of the first mechanical amplification system based on the pressure acting on the sensor into a deformation of the main body, wherein the first mechanical amplification system comprises a metal sheet composed of titanium, wherein each of the at least two internal electrodes is connected to the first external electrode or the second external electrode, wherein the first external electrode is arranged on a first side surface of the main body, wherein the second external electrode is arranged on a second side surface of the main body, and wherein the main body comprises an upper side surface, which is free of the first external electrode and the second external electrode, the method comprising:
   measuring the pressure on the upper side surface.

17. The method according to claim 16, wherein the sensor further comprises an evaluation unit connected to the at least two internal electrodes, and wherein the method comprises:
   generating a voltage between the at least two internal electrodes when the pressure is exerted on the upper side surface; and
   determining the pressure acting on the main body based on a current intensity measured by the evaluation unit or based on the voltage measured by the evaluation unit.

* * * * *